(12) United States Patent
Wilson et al.

(10) Patent No.: US 7,821,089 B2
(45) Date of Patent: Oct. 26, 2010

(54) PHOTODETECTOR ARRAY USING ISOLATION DIFFUSIONS AS CROSSTALK INHIBITORS BETWEEN ADJACENT PHOTODIODES

(75) Inventors: Robin Wilson, Belfast (GB); Conor Brogan, Belfast (GB); Hugh J. Griffin, Newtownabbey (GB); Cormac MacNamara, Belfast (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 0 days.

(21) Appl. No.: 12/204,371

(22) Filed: Sep. 4, 2008

(65) Prior Publication Data
US 2008/0315269 A1    Dec. 25, 2008

Related U.S. Application Data

(63) Continuation of application No. 11/548,546, filed on Oct. 11, 2006.

(60) Provisional application No. 60/725,876, filed on Oct. 11, 2005.

(51) Int. Cl.
*H01L 31/113*    (2006.01)

(52) U.S. Cl. .................. 257/431; 257/291; 257/446; 257/621; 257/E31.061

(58) Field of Classification Search .............. 257/184, 257/186, 431, 443, 446, 458, E31.061, 31.115, 257/E31.121, E33.076
See application file for complete search history.

(56) References Cited

U.S. PATENT DOCUMENTS

| | | | |
|---|---|---|---|
| 3,648,131 A | 3/1972 | Stuby | |
| 4,623,909 A * | 11/1986 | Nishizawa et al. | .......... 257/446 |
| 5,998,292 A | 12/1999 | Black et al. | |
| 6,087,719 A | 7/2000 | Tsunashima | |
| 6,426,991 B1 | 7/2002 | Mattson et al. | |
| 6,762,473 B1 | 7/2004 | Goushcha et al. | |

(Continued)

FOREIGN PATENT DOCUMENTS

WO    2005001941 A2    1/2005

(Continued)

OTHER PUBLICATIONS

U.S. Appl. No. 12/142,185, filed Jun. 19, 2008, Wilson et al.

*Primary Examiner*—Hung Vu
*Assistant Examiner*—Vernon P Webb
(74) *Attorney, Agent, or Firm*—Panitch Schwarze Belisario & Nadel LLP

(57) ABSTRACT

A photodetector array includes a semiconductor substrate having opposing first and second main surfaces, a first layer of a first doping concentration proximate the first main surface, and a second layer of a second doping concentration proximate the second main surface. The photodetector includes at least one conductive via formed in the first main surface and an anode/cathode region proximate the first main surface and the at least one conductive via. The via extends to the second main surface. The conductive via is isolated from the semiconductor substrate by a first dielectric material. The anode/cathode region is a second conductivity opposite to the first conductivity. The photodetector includes a doped isolation region of a third doping concentration formed in the first main surface and extending through the first layer of the semiconductor substrate to at least the second layer of the semiconductor substrate.

16 Claims, 3 Drawing Sheets

U.S. PATENT DOCUMENTS

| | | | |
|---|---|---|---|
| 6,831,367 B2 * | 12/2004 | Sekine | 257/774 |
| 7,279,729 B2 | 10/2007 | Roy | |
| 2004/0188793 A1 * | 9/2004 | Lindemann et al. | 257/457 |
| 2004/0238911 A1 * | 12/2004 | Roy | 257/444 |
| 2005/0275048 A1 | 12/2005 | Farnworth et al. | |
| 2006/0027934 A1 | 2/2006 | Edelstein et al. | |
| 2006/0157815 A1 | 7/2006 | Chang et al. | |
| 2007/0085117 A1 | 4/2007 | Wilson et al. | |

FOREIGN PATENT DOCUMENTS

| | | |
|---|---|---|
| WO | 2005031880 A1 | 4/2005 |

* cited by examiner

PHOTODETECTOR ARRAY USING ISOLATION DIFFUSIONS AS CROSSTALK INHIBITORS BETWEEN ADJACENT PHOTODIODES

CROSS-REFERENCE TO RELATED APPLICATIONS

This application is a continuation of U.S. patent application Ser. No. 11/548,546, filed Oct. 11, 2006, currently pending, entitled "Photodetector Array Using Isolation Diffusions as Crosstalk Inhibitors Between Adjacent Photodiodes," which claims priority to U.S. Provisional Patent Application No. 60/725,876, filed Oct. 11, 2005, entitled "Detector Array Using Isolation Diffusions as Crosstalk Inhibitors Between Adjacent Pixels," the contents of all of which are incorporated by reference herein.

BACKGROUND OF THE INVENTION

Embodiments of the present invention relate to a photodetector array, and more particularly, to a photodetector array using isolation diffusions as crosstalk inhibitors between adjacent photodiodes and a method for manufacturing a photodetector array using isolation diffusions.

A photon detector or photodetector (also called a photodiode) converts radiant power or light directly into electrical current. Positive-intrinsic-negative (PIN) diodes or PIN photodiodes are generally known in the art. A PIN/NIP diode is a form of photodetector.

A PIN diode is a type of photodiode with a large, neutrally doped intrinsic region sandwiched between p-doped and n-doped semiconducting regions. The PIN diode's name comes from the layering of these materials positive, intrinsic, negative (PIN). Broadly speaking, a photodiode is a semiconductor device that converts light to electrical current. A PIN diode typically exhibits an increase in its electrical conductivity as a function of the intensity, wavelength, and modulation rate of the incident radiation or light.

A PIN diode is also a semiconductor device that operates as a variable resistor at radiofrequency (RF) and microwave frequencies. The resistance value of the PIN diode is determined only by the forward biased direct current (DC) current. At high RF frequencies when a PIN diode is at zero or a reverse bias, it appears as a parallel plate capacitor, essentially independent of the reverse voltage.

Photoconductor arrays are groups of a plurality of photodetectors, such as PIN/NIP diodes, arranged together on a substrate or wafer. Crosstalk between photodiodes is seen when the light detection and conversion process of one photodiode affects the detection and conversion processes of adjacent photodiodes. Prior art methods of eliminating crosstalk involved forming dielectric filled trenches to isolate adjacent photodiodes from one another.

It is desirable to provide a photodetector array using isolation diffusions to eliminate the need to form another set of trenches in the semiconductor substrate. Further, it is desirable to provide a photodetector array using isolation diffusions as crosstalk inhibitors between adjacent photodiodes.

BRIEF SUMMARY OF THE INVENTION

Briefly stated, one embodiment of the present invention comprises a photodetector array that includes a semiconductor substrate having first and second main surfaces opposite to each other and having a first layer of a first doping concentration proximate the first main surface and a second layer of a second doping concentration proximate the second main surface. The photodetector includes at least one conductive via formed in the first main surface and an anode/cathode region proximate the first main surface and the at least one conductive via. The at least one via extends to the second main surface of the semiconductor substrate. The at least one conductive via is isolated from the semiconductor substrate by a first dielectric material. The anode/cathode region has a second conductivity opposite to the first conductivity. The photodetector also includes a doped isolation region formed in the first main surface and extending through the first layer of the semiconductor substrate to at least the second layer of the semiconductor substrate. The doped isolation region has a third doping concentration different than the first doping concentration.

Another embodiment of the present invention further comprises a method of manufacturing a photodetector array including providing a semiconductor base having first and second main surfaces opposite to each other. The semiconductor base is of a first conductivity and a first relative doping concentration. A semiconductor layer having first and second main surfaces opposite to each other and having a second relative doping concentration is provided. The second main surface of the semiconductor layer is bonded to the first main surface of the semiconductor base. At least one trench is formed in the first main surface of the semiconductor layer. The at least one trench extends through the semiconductor layer and to a first depth position in the semiconductor base. A dielectric layer is formed on the sidewalls of the at least one trench, and the at least one trench is filled with a conductive material to form a via. The first main surface is selectively masked with a first mask. The first main surface of the semiconductor layer is doped with a first dopant of a first conductivity to form a doped isolation region. The doped isolation region extends through the semiconductor layer to at least the first main surface of the semiconductor base, the doped isolation region having the first relative doping concentration.

Yet another embodiment of the present invention comprises a method of manufacturing a photodetector array including providing a semiconductor base with opposing first and second main surfaces and a semiconductor layer with opposing first and second main surfaces, the first main surface of the semiconductor base being bonded to the second main surface of the semiconductor layer. The semiconductor base is of a first conductivity and a first relative doping concentration. The semiconductor layer is of a second relative doping concentration. At least one trench is formed in the first main surface of the semiconductor layer. The at least one trench extends through the semiconductor layer and to a first depth position in the semiconductor base. A dielectric layer is formed on the sidewalls of the at least one trench, and the at least one trench is filled with a conductive material to form a via. The first main surface is selectively masked with a first mask. The first main surface of the semiconductor layer is doped with a first dopant of a first conductivity to form a doped isolation region. The doped isolation region extends through the semiconductor layer to at least the first main surface of the semiconductor base, the doped isolation region having the first relative doping concentration. The first mask is removed from the first main surface of the semiconductor layer. The first main surface is selectively masked with a second mask. The first main surface is doped with a second dopant of a second conductivity to form an anode/cathode region. The second mask is removed from the first main surface. A second dielectric layer is formed on the first main surface. A first portion of the second dielectric layer over the conductive via is selectively removed. A second portion of the second dielectric layer, spaced apart from the removed first portion, over the anode/cathode region is also selectively removed. A conductive connector is formed between the exposed conductive via and the exposed anode/cathode region. A passivation layer is applied using one of thermal growth, low pressure (LP) chemical vapor deposition (CVD), plasma enhanced chemical vapor deposition (PECVD), Atmospheric pressure chemical vapor deposition (APCVD), spun-on-glass (SOG), glass frit, deposition, direct application, and combinations thereof. The second main surface of the semiconductor base is at least one of planarized, grinded and polished. A third dielectric layer is formed on the second main surface of the semiconductor base. Portions of the third dielectric layer are selectively removed. Backside contacts are added where the portions of the third dielectric layer were removed.

BRIEF DESCRIPTION OF THE SEVERAL VIEWS OF THE DRAWINGS

The foregoing summary, as well as the following detailed description of preferred embodiments of the present invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
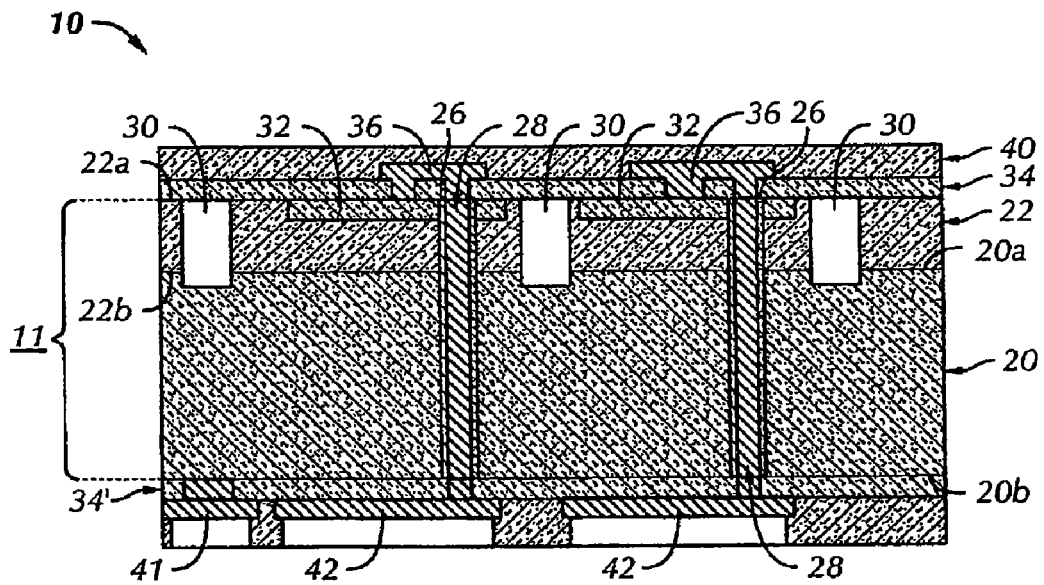
FIG. 1 is a partial cross-sectional elevational view of a photodetector array using isolation diffusions in accordance with a first preferred embodiment of the present invention.
Figure 2:
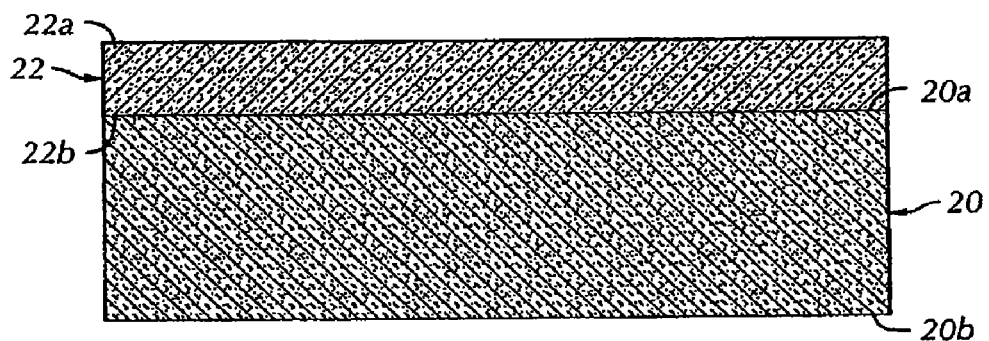
FIG. 2 is a partial cross-sectional elevational view of a semiconductor substrate used to form the photodetector array of FIG. 1.

Certain terminology is used in the following description for convenience only and is not limiting. The words "right", "left", "lower", and "upper" designate directions in the drawings to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the words "a" and "an" as used in the claims and in the corresponding portion of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, the reference to n or p can also mean that either n and p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like numerals reference indicate like elements throughout, there is shown in FIG. 1 a photodetector array, generally 10, in accordance with a preferred embodiment of the present invention.

The photodetector array 10 includes a semiconductor substrate 11 having first and second main surfaces 22a and 20b opposite to each other and having a first layer 22 of a first doping concentration proximate the first main surface 22a and a second layer 20 of a second doping concentration proximate the second main surface 20b. The photodetector 10 includes at least one conductive via 28 formed of an undoped polysilicon (poly), doped poly, or a metal material in the first main surface 22a and an anode/cathode region 32 proximate the first main surface 22a and the at least one conductive via 28. The at least one via 28 extends to the second main surface 20b of the semiconductor substrate 11. The at least one conductive via 28 is isolated from the semiconductor substrate 11 by a first dielectric material 26. The first anode/cathode layer 32 is of a second conductivity opposite to the first conductivity. The photodetector 10 also includes a doped isolation region 30 formed in the first main surface 22a and extending through the first layer 22 of the semiconductor substrate 11 to at least the second layer 20 of the semiconductor substrate 11. The doped isolation region 30 has a third doping concentration different than the first doping concentration.

The photodetector array 10 also includes backside contacts 41 and 42 formed proximate the second main surface 20b.

It should be noted that the first conductivity can be one of p-type and n-type and the second conductivity can be the other one of p-type and n-type without departing from the invention. The photodetectors in the array may be, for example, positive-intrinsic-negative (PIN) diodes or negative-intrinsic-positive (NIP) diodes without departing from the invention.

Preferably, the semiconductor substrate is formed of silicon (Si). But, the semiconductor substrate may be formed of other materials such as gallium arsenide (GaAs), germanium (Ge) or the like.

Generally, if a semiconductor crystal contains no impurities, the only charge carriers present are those produced by thermal breakdown of the covalent bonds and the conducting properties are characteristic of the pure semiconductor material. Such a crystal is termed an "intrinsic" semiconductor. When used with reference to a PIN or NIP diode, conventional usage in the art includes lightly doped intrinsic areas. While used herein to refer to the semiconductor substrate or substrate/epitaxial layer as "intrinsic", embodiments of the present invention recognize that the photodetector array 10 in accordance with embodiments of the present invention will work comparably with undoped substrates even when the semiconductor substrate has been lightly doped or even more heavily doped. Accordingly, the term "intrinsic" should not be construed as limiting and embodiments of the present invention can embrace pure and doped semiconductor substrates formed of various materials.

Preferably, the photodetector array 10 includes a plurality of isolation diffusion regions 30 formed in the first main surface 22a and a plurality of adjacent anodes/cathodes 32 defined by the isolation diffusion regions 30. The plurality of anodes/cathodes 32 may be associated with photodiodes when the photodetector array 10 is used in an imaging application such as X-ray or computed tomography (CT) imaging or the like.

Figure 3:
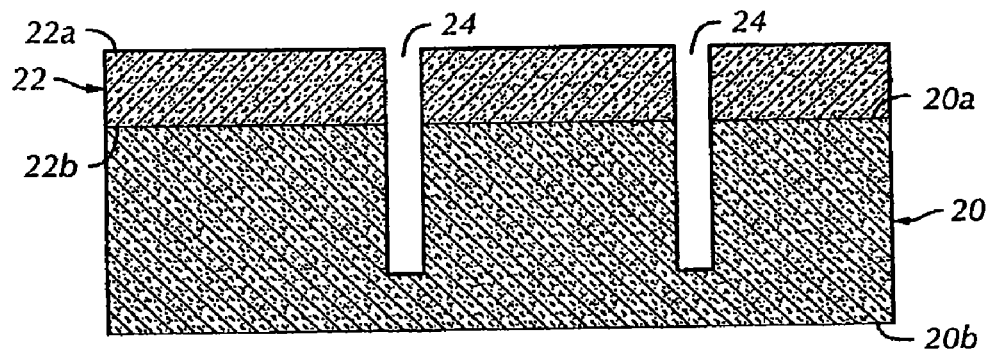
FIG. 3 is a partial cross-sectional elevational view of the semiconductor substrate of FIG. 2 after a trenching step.
Figure 4:
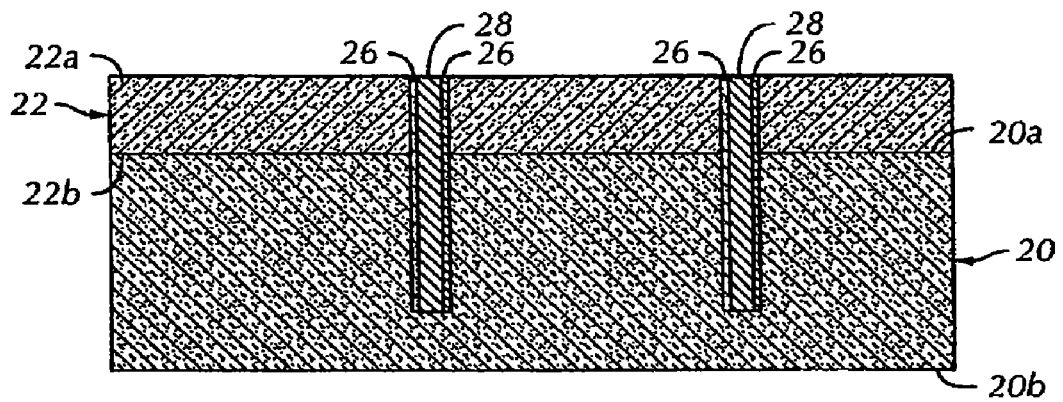
FIG. 4 is a partial cross-sectional elevational view of the semiconductor substrate of FIG. 3 after dielectric lining and trench filling steps.
Figure 5:
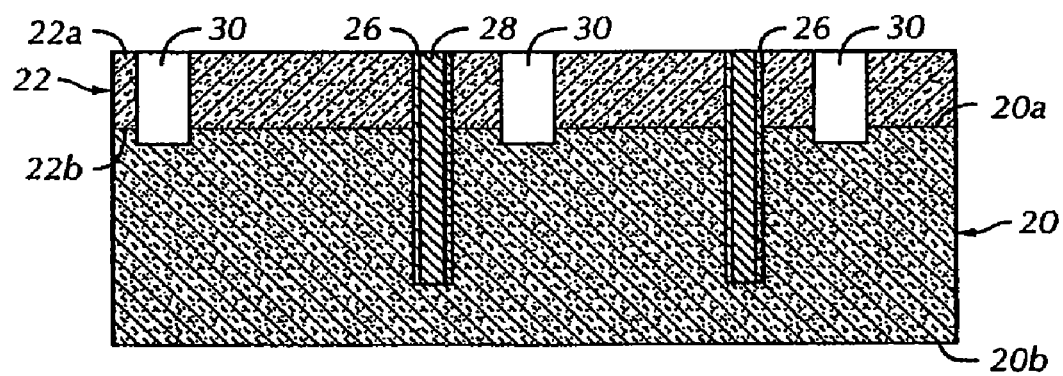
FIG. 5 is a partial cross-sectional elevational view of the semiconductor substrate of FIG. 4 after a first doping step.
Figure 6:
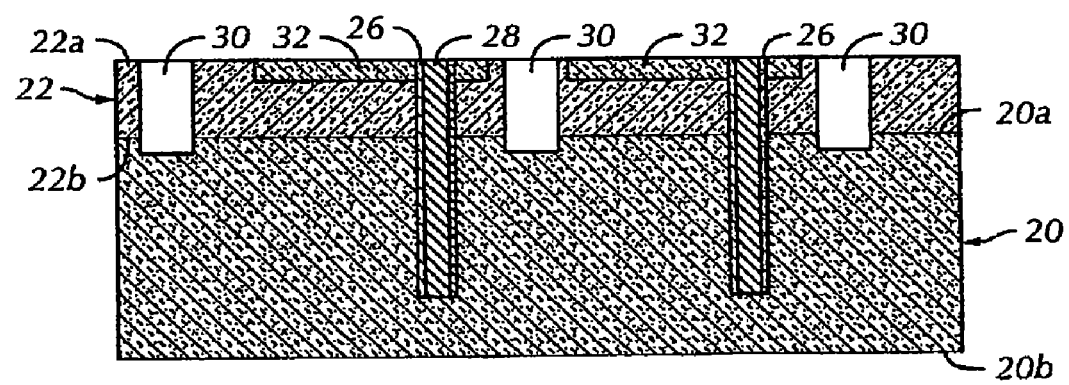
FIG. 6 is a partial cross-sectional elevational view of the semiconductor substrate of FIG. 5 after a second doping step.
Figure 7:
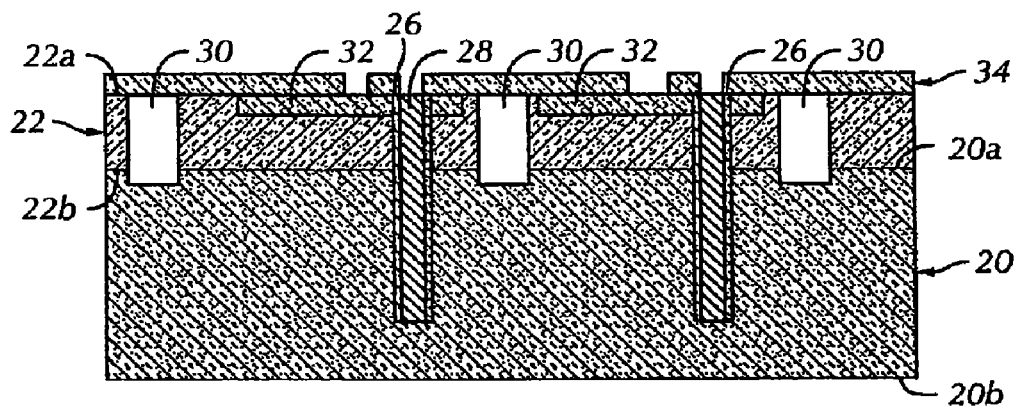
FIG. 7 is a partial cross-sectional elevational view of the semiconductor substrate of FIG. 6 after oxide layer forming and partial oxide layer removal steps.
Figure 8:
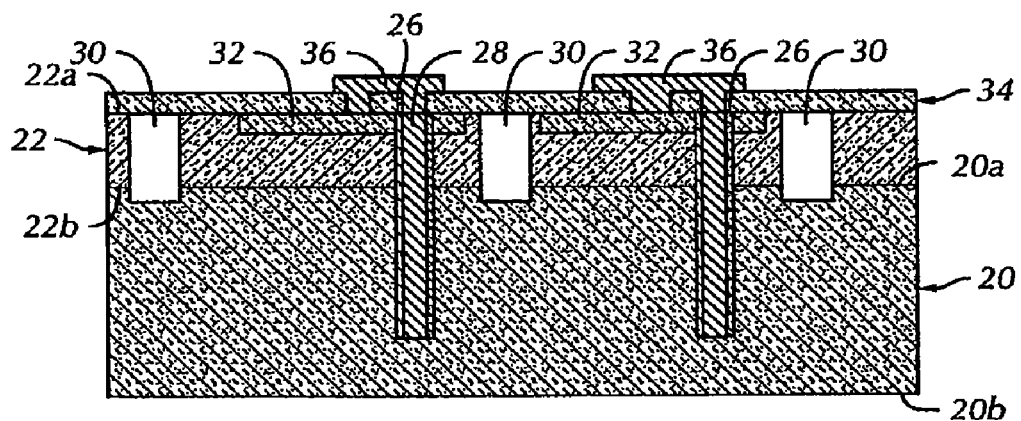
FIG. 8 is a partial cross-sectional elevational view of the semiconductor substrate of FIG. 7 after a conductive connector forming step.

Referring now to FIGS. 2-9, a method of manufacturing the photodetector array 10 includes providing a semiconductor base 20 having first and second main surfaces 20a and 20b opposite to each other. The semiconductor base 20 is of a first conductivity and a first relative doping concentration. A semiconductor layer 22 having first and second main surfaces 22a and 22b opposite to each other and having a second relative doping concentration is provided. The second main surface 22b of the semiconductor layer 22 is bonded to the first main surface 20a of the semiconductor base 20. As shown in FIG. 3, at least one trench 24 is formed in the first main surface 22a of the semiconductor layer and extends through the semiconductor layer 22 and to at least a first depth in the semiconductor base 20. As shown in FIG. 4, a first dielectric layer 26 is formed on the sidewalls of the at least one trench 24, and the at least one trench 24 is filled with a conductive material 28, such as undoped poly, doped poly or a metal, to form a via. The first main surface 22a is selectively masked with a first mask (not shown). As shown in FIG. 5, the first main surface 22a of the semiconductor layer 22 is doped with a first dopant of a first conductivity to form a doped isolation region 30. The doped isolation region 30 extends through the semiconductor layer 22 to at least the first main surface 20a of the semiconductor base 20. The doped isolation region 30 has the first relative doping concentration. The first main surface 22a is masked with a second mask (not shown) and the first main surface 22a of the semiconductor layer 22 is doped with a second dopant of a second conductivity to form an anode/cathode region 32 as shown in FIG. 6. The anode/cathode region 32 extends around the first dielectric layer 26 surrounding the via 28. The second mask is removed from the first main surface 22a. A second dielectric layer 34, preferably an oxide layer, is formed on the first main surface 22a of the semiconductor layer 22 as shown in FIG. 7. A first portion of the oxide layer 34 is selectively removed over the conductive material via 28, and a second portion of the oxide layer 34, spaced apart from the removed first portion, is selectively removed over the anode/cathode region 32. A conductive connector 36 is formed between the exposed conductive material via 28 and the exposed anode/cathode region 32 as shown in FIG. 8.

The surfaces of the semiconductor base 20 and/or the semiconductor layer 22 may be smoothed, if needed, using one or more of the following process steps:
(i) an isotropic plasma etch may be used to remove a thin layer of material (typically 100-1000 Angstroms (Å)) from the surfaces;
(ii) a sacrificial silicon dioxide layer may be grown on the surfaces and then removed using an etch such as a buffered oxide etch or a diluted hydrofluoric (HF) acid etch.

The use of either or both of these techniques can produce smooth surfaces with rounded corners while removing residual stress and unwanted contaminates.

The doping is performed by one of ion implantation, solid diffusion, liquid diffusion, spin-on deposits, plasma doping, vapor phase doping, laser doping or the like. Doping with boron B results in a more p-type region, doping with phosphorus results in a more n-type region and doping with arsenic Ar results in a more n-type region. Other dopants may be utilized such as antimony Sb, bismuth Bi, aluminum Al, indium In, gallium Ga or the like depending on the material of the substrate and the desired strength of the doping.

Preferably, the first and second dopants are driven-in by a diffusion step. The semiconductor substrate 11 is placed in a suitable diffusion chamber at about 700° C. to about 1200° C. proximate to a solid source such as boron or phosphorous. Alternatively, the semiconductor substrate can be exposed to a liquid source of dopant at about 700° C. to about 1200° C.

Alternatively, the first dopant may be implanted. The semiconductor layer 22 is implanted by boron B, phosphorus P, arsenic As or the like, at a high energy level in the range of about 40 to 1000 kilo-electronvolts (KeV). Preferably, the energy level is in the range of about 200 to 1000 KeV, but it should be recognized that the energy level should be selected to sufficiently implant the dopant. The second dopant may be by boron B, phosphorus P, arsenic Ar or the like. Another drive-in step at a temperature of up to 1200° Celsius may be performed for up to 12 hours so that implanted dopant is sufficiently driven into the substrate.

Other processing steps, as known in the art, may be utilized without departing from the invention. For example, the bonding may be performed by one of direct wafer bonding, anodic bonding or the like. The trench 24 etching process can be a chemical etch, mechanical etch, a plasma etch, a Reactive Ion Etch (RIE) or the like. The dielectric materials 26 and 34 may be deposited using a low pressure (LP) chemical vapor deposition (CVD), Tetraethylorthosilicate (TEOS), or a spun-on-glass (SOG) deposition technique, or any other oxide deposition technique as is known in the art. The trench 24 can be filled by a reflow process or the like. The mask may be formed by photolithography or other mask forming processes as known in the art. The oxide 34 removal may be accomplished by Chemical Mechanical Polish (CMP), etching, grinding, polishing, or the like as known in the art. The conductive connectors may be formed by sputtering, evaporation, and/or electroplating or the like.

Figure 9:
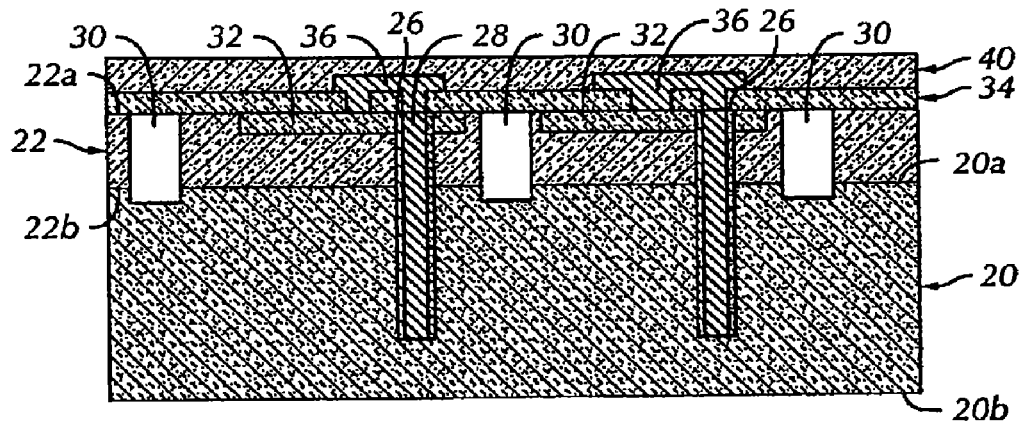
FIG. 9 is a partial cross-sectional elevational view of the semiconductor substrate of FIG. 8 after a passivation material application step.

Optionally, a first passivation material 40 is applied over the oxide layer 34 and conductive connector 36 as shown in FIG. 9. The first passivation material 40 is one of an oxide, a nitride, a glass, polysilicon and combinations thereof. The passivation material 40 is applied using one of thermal growth, LP CVD, plasma enhanced chemical vapor deposition (PECVD), Atmospheric pressure chemical vapor deposition (APCVD), spun-on-glass (SOG), glass frit, deposition, direct application and combinations thereof. The passivation material is one of an oxide, a nitride, a glass and doped or undoped poly. While not required, the passivation material improves the performance of the photodetector array 10.

The photodetector array 10 may be shipped as is after FIG. 9, or it may be optionally back grinded to expose the filled trenches 24 on the second main surface 20b. A third dielectric layer 34', preferably an oxide layer, is formed on the second main surface 20b, with portions selectively removed for forming a backside contact 41 and a peripheral contact 42 as shown in FIG. 1. Backside contact 41 is preferably formed by sputtering, evaporation and/or electroplating and peripheral contact 42 is similarly preferably formed in contact with the first anode/cathode region 32 resulting in the photodetector array shown in FIG. 1. The contacts may be a metal such as aluminum Al, aluminum silicon Al[% Si], copper Cu, gold Au, silver Ag, titanium Ti, tungsten W, nickel Ni or the like and combinations thereof or may be doped or undoped polysilicon. The contacts may also be layers of differing metals.

Other processing steps, as is known in the art, may be utilized without departing from the invention. For example, the trenches 24 used to make the conductive vias 28 may be smoothed, if needed, using processing steps such as an isotropic plasma etch or deep ion etching such as deep RIE. Portions of the silicon substrate 11 or the entire device 10 may have a sacrificial silicon dioxide layer grown thereon prior and then may be etched using a buffered oxide etch or a diluted hydrofluoric (HF) acid etch or the like to produce smooth surfaces and/or rounded corners thereby reducing residual stress and unwanted contaminants. Furthermore, additional layers in addition to the passivation layer(s) may be added as desired. Furthermore, the conductive semiconductor substrate 11 can be doped, implanted and/or diffused to achieve a particular conductivity.

Another method of manufacturing a photodetector array 10 in accordance with a third preferred embodiment of the present invention includes providing a first semiconductor substrate 20 having first and second main surfaces 20a and 20b opposite to each other. The first semiconductor substrate 20 is of a first conductivity. A second semiconductor substrate 22 having first and second main surfaces 22a and 22b opposite to each other is provided, and the second semiconductor substrate 22 is of the first conductivity. The first main surface 20a of the first semiconductor substrate 20 is bonded to the second main surface 22b of the second semiconductor substrate 22. The bonding process may include annealing the substrates 20 and 22 in an annealing furnace at up to 1200° C. for a period of about a few minutes to six hours. Optionally, the bonding steps may include wetting the surfaces 20a and 22b of the semiconductor substrates 20 and 22 with a solution such as water ($H_2O$) and hydrogen peroxide ($H_2O_2$) and then pressing the wetted semiconductor substrates 20 and 22 together and drying them prior to annealing at 800-1200° C. Plasma etches are used to remove impure oxides on the surfaces 20a and 22b of the semiconductor substrates 20 and 22 to be bonded. All of the other processing steps are then performed to form the photodetector array 10.

Another method of manufacturing a photodetector array 10 in accordance with a fourth preferred embodiment of the present invention includes providing a semiconductor substrate 20 having first and second main surfaces 20a and 20b opposite to each other. The semiconductor substrate 20 is of a first conductivity. An epitaxial layer 22 of the first conductivity is deposited or grown on the first main surface 20a of the semiconductor substrate 20. The epitaxial growth or deposition may occur in a suitable reaction chamber at a temperature of up to about 1200° C. All of the other processing steps are then performed to form the photodetector array 10.

Accordingly, a photodetector array 10 can be formed from a single substrate 11 that is appropriately doped on both sides; can be formed from multiple substrates 20 and 22 that are bonded together and appropriately doped; can be formed from a substrate 20 with an epitaxial growth layer 22 which is suitably doped; or can be formed from a substrate 20 with an epitaxial growth layer 22 wherein the substrate is appropriately doped.

From the foregoing, it can be seen that embodiments of the present invention are directed to a photodetector diode using isolation diffusions and methods for manufacturing a photodetector diode using isolation diffusions. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the embodiments of the present invention as defined by the appended claims.

We claim:

1. A photodetector array comprising:
   a first semiconductor substrate having first and second main surfaces opposite to each other, the first semiconductor substrate being of a first conductivity and having a first doping concentration;
   a second semiconductor substrate having first and second main surfaces opposite to each other, the second semiconductor substrate being of the first conductivity and having a second doping concentration, the first main surface of the first semiconductor substrate being bonded to the second main surface of the second semiconductor substrate;
   at least one conductive via formed in the first main surface of the second semiconductor substrate, the at least one via extending to the second main surface of the first semiconductor substrate, the at least one conductive via being isolated from the first and second semiconductor substrates by a first dielectric material;
   an anode/cathode region proximate the first main surface of the second semiconductor substrate and the at least one conductive via, the anode/cathode region being of a second conductivity opposite to the first conductivity; and
   a doped isolation region formed in the first main surface of the second semiconductor substrate and extending through the second semiconductor substrate to the first semiconductor substrate, the doped isolation region having a third doping concentration different than the first doping concentration.

2. The photodetector array according to claim 1, further comprising:
   a second dielectric layer formed on the first main surface of the second semiconductor substrate; and
   a conductive connector connecting the conductive via and the anode/cathode region through the second dielectric layer.

3. The photodetector array according to claim 2, further comprising
   a passivation layer formed over the second dielectric layer and the conductive connector.

4. The photodetector array according to claim 3, wherein the material of the passivation layer comprises one of an oxide, a nitride, a glass, polysilicon and combinations thereof.

5. The photodetector array according to claim 2, further comprising:
   a third dielectric layer formed on the second main surface of the first semiconductor substrate.

6. The photodetector array according to claim 2, wherein the first semiconductor substrate is heavily doped n-type and the second semiconductor substrate is lightly doped.

7. The photodetector array according to claim 1, wherein the first conductivity is one of p-type and n-type and the second conductivity is the other one of p-type and n-type.

8. The photodetector array according to claim 1, further comprising:
   backside contacts formed proximate the second main surface of the first semiconductor substrate.

9. A photodetector array comprising:
   a semiconductor substrate having first and second main surfaces opposite to each other, the semiconductor substrate being of a first conductivity and having a first doping concentration;

an epitaxial layer formed on the first main surface of the semiconductor substrate, the epitaxial layer having a first main surface opposite to the first main surface of the semiconductor substrate and a second main surface proximate the first main surface of the semiconductor substrate, the epitaxial layer being of the first conductivity and having a second doping concentration;

at least one conductive via formed in the first main surface of the epitaxial layer, the at least one via extending to the second main surface of the semiconductor substrate, the at least one conductive via being isolated from the epitaxial layer and the semiconductor substrate by a first dielectric material;

an anode/cathode region proximate the first main surface of the epitaxial layer and the at least one conductive via, the anode/cathode region being of a second conductivity opposite to the first conductivity; and a doped isolation region formed in the first main surface of the epitaxial layer and extending through the epitaxial layer to the semiconductor substrate, the doped isolation region having a third doping concentration different than the first doping concentration.

10. The photodetector array according to claim 9, further comprising:

a second dielectric layer formed on the first main surface of the epitaxial layer; and a conductive connector connecting the conductive via and the anode/cathode region through the second dielectric layer.

11. The photodetector array according to claim 10, further comprising a passivation layer formed over the second dielectric layer and the conductive connector.

12. The photodetector array according to claim 11, wherein the material of the passivation layer comprises one of an oxide, a nitride, a glass, polysilicon and combinations thereof.

13. The photodetector array according to claim 10, further comprising:

a third dielectric layer formed on the second main surface of the semiconductor substrate.

14. The photodetector array according to claim 10, wherein the semiconductor substrate is heavily doped n-type and the epitaxial layer of the semiconductor substrate is lightly doped.

15. The photodetector array according to claim 9, wherein the first conductivity is one of p-type and n-type and the second conductivity is the other one of p-type and n-type.

16. The photodetector array according to claim 9, further comprising:

backside contacts formed proximate the second main surface of the semiconductor substrate.

* * * * *